310-335

1/3/84 OR 4,424,465

SR

United States Patent [19]

Ohigashi et al.

[11] 4,424,465

[45] Jan. 3, 1984

[54] PIEZOELECTRIC VIBRATION TRANSDUCER

[75] Inventors: Hiroji Ohigashi, Zushi; Toshiharu Nakanishi, Kamakura; Miyo Suzuki, Fujisawa, all of Japan

[73] Assignee: Toray Industries, Inc., Tokyo, Japan

[21] Appl. No.: 434,713

[22] Filed: Oct. 15, 1982

Related U.S. Application Data

[63] Continuation of Ser. No. 149,989, May 15, 1980, abandoned.

[51] Int. Cl.$^3$ .......... H01L 41/08

[52] U.S. Cl. .......... 310/335; 310/336; 310/800; 310/366

[58] Field of Search .......... 310/334–337, 310/800, 366, 367, 369

[56] References Cited

U.S. PATENT DOCUMENTS

| | | | |
|---|---|---|---|
| 3,433,461 | 3/1969 | Scarpa | 310/335 |
| 3,968,680 | 7/1976 | Vopilkin et al. | 310/369 X |
| 4,184,094 | 1/1980 | Kopel | 310/335 |
| 4,217,516 | 8/1980 | Iinuma et al. | 310/335 |
| 4,296,349 | 10/1981 | Nakanishi | 310/800 |

OTHER PUBLICATIONS

Experimental Broadband Ultrasonic Transducers Using $PVF_2$ Piezoelectric Film, by Bui, Shaw & Zitelli, Electronics Letters, 8-5-76, vol. 17, No. 6.

Monolithic Silicon-$PVF_2$ Piezoelectric Arrays for Ultrasonic Imaging, by Swartz & Plummer, presented at the 8th International Symposium on Acoustic Imaging, Key Biscayne, Fla., 5-29-78. Performed Under NIH Grant No. 5 PO1GM17940-03.

*Primary Examiner*—Mark O. Budd
*Attorney, Agent, or Firm*—Barnes & Thornburg

[57] ABSTRACT

A piezoelectric vibration transducer is disclosed which includes a polymeric piezoelectric film as the active element. The film is a selectively or fully polarized, uniaxially oriented material selected from the group of polyvinylidene fluoride, blended material such as polyvinylidene fluoride and PZT powder, polyvinyl fluoride, polyacrylonitrile, copolymers or vinylidene fluoride such as vinylidene fluoride and tetrafluoroethylene or trifluoroethylene. The film is bonded to electrode strips formed by printed circuit methods and then overcoated with a front electrode layer. The sandwich formed by the electrode layers and intermediate polymeric piezoelectric film can be reversed so that the front electrode layer is discontinuous while the back electrode layer is continuous, or both electrode layers can be formed to be discontinuous. Special configurations for the discontinuous pattern of electrode layers can be employed such as that specified by Fresnel's theory.

20 Claims, 14 Drawing Figures

PIEZOELECTRIC VIBRATION TRANSDUCER

This is a continuation of application Ser. No. 149,989 filed May 15, 1980 now abandoned.

BACKGROUND OF THE INVENTION

1. Field of the Invention

The present invention relates to transducers having multiple piezoelectric vibration elements for sending and/or receiving ultrasonic waves and has particular reference to novel compositions of the active element therein.

The transducer having multiple piezoelectric vibration elements is preferably used for scanning ultrasonic waves and/or focusing ultrasonic waves. The scanning is usually classified into linear type scanning and sector type scanning according to the driving order of the arranged piezoelectric vibration elements in an array.

2. General Description of the Prior Art

In the past, the piezoelectric vibration elements in the array have been constructed with inorganic material e.g. PZT, BaTiO3, quartz. An array of parallel strip lines of piezoelectric vibration elements has been fabricated by forming a plate of inorganic piezoelectric material having desired dimensions and dividing the plate into many parallel strip lines having desired width and pitch using a cutting machine.

In the conventional fabrication of the multiple piezoelectric vibration element transducer, considerable difficulties have been experienced in obtaining a proper plate made of sintered inorganic powder without cracks and defects which are believed to occur during the sintering of the inorganic powder and during the cutting of the hard and brittle inorganic plate.

Efforts to increase the yield in the conventional fabrication process for producing multiple piezoelectric vibration element transducers has shown its inadequacy. Also, in the conventional fabrication of multiple piezoelectric vibration element transducers, considerable difficulty has been experienced in obtaining an array comprising many parallel micro strip lines because of dimensional limitations of mechanical working. Further, in the conventional fabrication, it is difficult to obtain separated strips having even thickness and even piezoelectric activity which are needed to give uniform frequency characteristic and uniform efficiency between the separated strips.

It, therefore, becomes apparent that obtaining separated strips having uniform characteristic and also obtaining arrays having uniform characteristic has been not easy, and has been in extremely high cost. It has also been observed that the sound velocity in inorganic piezoelectric elements is large, therefore, each piezoelectric vibration strip has been designed such that the ratio of the height to the width of the strip is inevitably large. This inevitable selection has a tendency to cause much crosstalk between the vibration strips, and to cause undesired vibrational modes of the vibration in the strips, which, in turn, cause increasing intensity of side lobes, decreasing resolving power, and decreasing signal-noise ratio.

Further, in application of the piezoelectric vibration transducer in the field of ultrasound diagnosis of living tissue, the transducer shows a reverberation phenomena or narrowing of band width phenomena which causes decreasing resolving power in the depth direction of the examined object due to the great difference in acoustic impedance between the inorganic material and water or living tissue.

Theoretically, a focusing type transducer can be formed with an array comprising piezoelectric vibration strips having a cylindrical shape along the line of such strip. But such preparation is not feasible because of difficulty of polishing a hard surface of the strip of inorganic material made to a cylindrical shape having the intended accuracy of dimensions. Thus, in the past, when constructing a focusing type transducer, it has been fabricated by preparing an array of piezoelectric vibration strips having flat surfaces and attaching an acoustical lens having a desired cylindrical front surface with a radius of curvature lying in the place normal to the scanning direction. However, such a focusing type transducer with an acoustical lens has limitations of focusing power caused by the characteristic of an acoustical lens itself the limitations on selection of materials for an acoustical lens to prevent occurrence of noise and decreasing efficiency caused by multiple reflections at the boundary between the piezoelectric vibration elements and the lens, or between the lens and water or living tissue.

SUMMARY OF THE INVENTION

It is an object of the present invention to provide a scanning and/or focusing type piezoelectric vibration transducer overcoming the above objects by utilizing a polymer piezoelectric film as the active element therein.

It is a further object of the present invention to provide a sensitive scanning and/or focusing type piezoelectric vibration transducer.

A still further object of the present invention is to provide a scanning and/or focusing type piezoelectric vibration transducer having simple construction, being easily fabricated at low cost.

Other and further objects of the present invention subsequently will become apparent by reference to the following description in conjunction with the accompanying drawings.

In accordance with the basic aspect of the present invention, a piezoelectric vibration transducer comprises a series of vibration elements fabricated with a polymeric piezoelectric film sandwiched by electrode plates, and lead wires connected to the electrode plates.

DETAILED DESCRIPTION OF THE PRIOR ART

Figure 1:
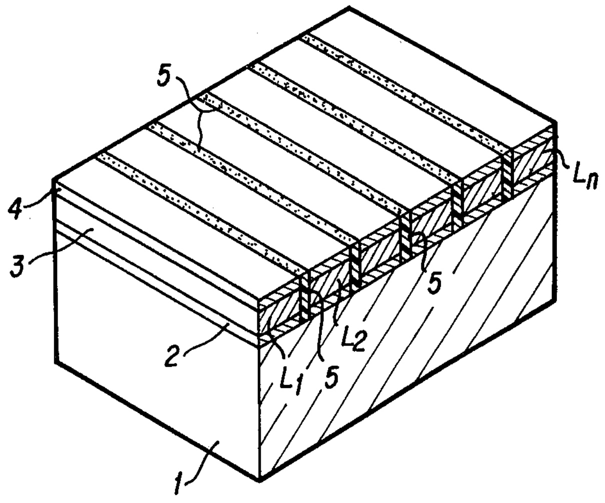
FIG. 1 PRIOR ART
FIG. 1 illustrates a schematic perspective view of a conventional prior art scanning type piezoelectric vibration transducer for the purpose of explaining its fabrication.

The conventional prior art scanning type piezoelectric vibration transducer shown in FIG. 1 is fabricated by forming a rear electrode plate 2 on a rear sound absorbing body 1. A piezoelectric plate 3 made of sintered PZT powder is bonded to the rear electrode plate 2. The fabricated layer comprising the piezoelectric plate 3 and the rear electrode plate 2 is divided into many parallel strip lines (L1, L2,—, Ln) having a desired width and pitch by cutting slits into the fabricated layer 2,3. Afterward, a front electrode plate 4 is formed on the surface of each strip line (Ln). Finally, the gaps between strip lines (L1, L2,—, Ln) are filled with an electric and acoustic insulating material 5.

Figure 2:
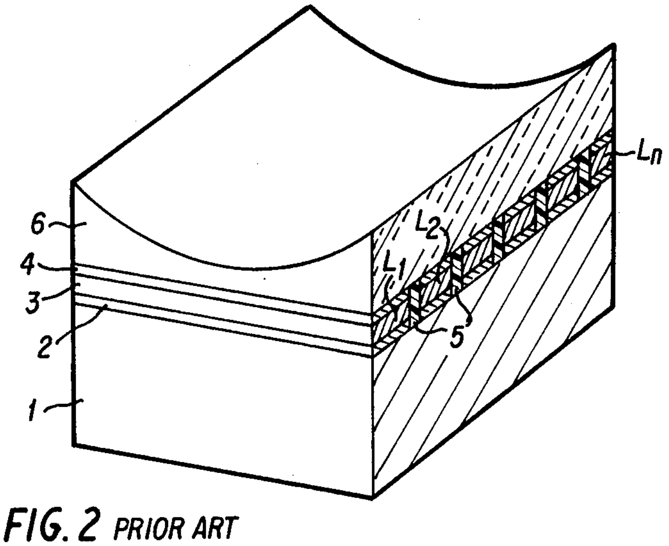
FIG. 2 PRIOR ART
FIG. 2 illustrates a schematic perspective view of a conventional prior art scanning and focusing type piezoelectric vibration transducer for the purpose of explaining its fabrication.

The conventional focusing and scanning type transducer illustrated in FIG. 2 is formed by attaching a cylindrical acoustical lens 6 on the front surface of the transducer shown in FIG. 1. The previous description relating to the problems presented by the prior art is more clearly understood by referring to the above fabrication processes.

DESCRIPTION OF THE PREFERRED EMBODIMENTS

Figure 3:
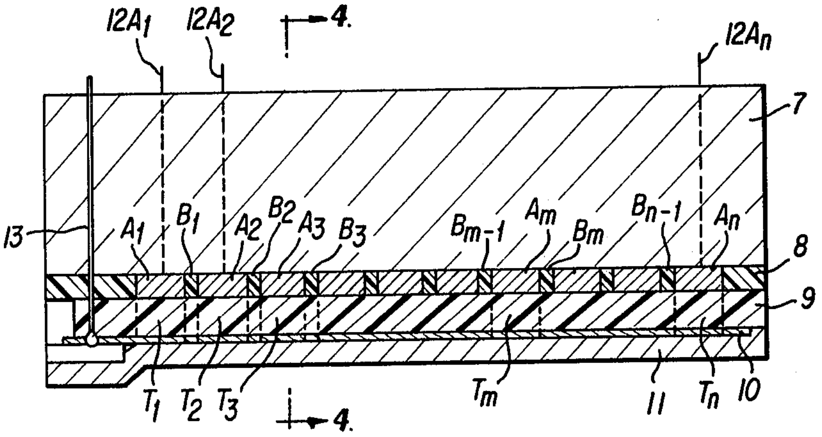
FIG. 3 illustrates a schematic longitudinal cross-section view of one embodiment of the scanning type piezoelectric vibration transducer in accordance with the present invention.
Figure 4:
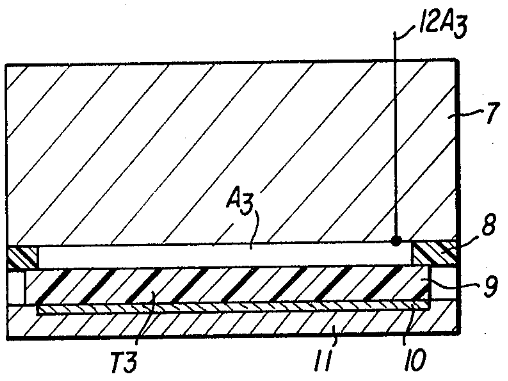
FIG. 4 illustrates a schematic traverse cross-section view at the plane 4—4 of the transducer shown in FIG. 3.

A first embodiment of the present invention comprises a supporting body 7 as illustrated in FIGS. 3 and 4. A series of rear electrode strips (A1, A2,—, An) serving concurrently as rear reflector plates are formed on the front surface of the supporting body 7. A sheet of polymeric piezoelectric film 9 is attached to the surface of the series of rear electrode strips (A1, A2,—, An). A front electrode plate sheet 10 is attached to the front surface of the polymeric piezoelectric film 9. A front protecting layer 11 is formed on the front surface of the front electrode plate 10. An insulating material fills the clearances (B1, B2,—, Bn−1) between the rear electrode strips (A1, A2,—, An), and between the supporting body 7 and the polymeric piezoelectric film 9. Lead wires (12A1, 12A2,—, 12An) are connected to the rear electrode strips (A1, A2,—, An), and a lead wire 13 is connected to the front electrode plate 10.

The supporting body 7 is formed with an inorganic material or a polymeric material having low acoustic impedance such as bakelite, polymethylmethacrylate, polystyrene, polyethylene, polyethylene terephthalate, epoxy resin reinforced with glass fibers, or nylon.

The series of rear electrode strips combined with rear reflector plates (A1, A2,—, An) is fabricated by bonding a thin plate of material having good electric-conductivity and large acoustic impedance such as Ag, Au, Cu, Fe, or Ni, and by dividing the thin plate into strips using forming techniques well-known in the printed circuit board art such as etching or ruling, or other suitable techniques.

The gaps between the strips (A1, A2,—, An) on the supporting body 7 are filled with an insulating material and the surface including the surfaces of the strips are made flat, however, the filling up the gaps is not always necessary.

A sheet of polymeric piezoelectric film 9 is bonded to the surface of the series of rear electrode strips (A1, A2,—, An). The polymeric piezoelectric film is obtained by applying a high voltage under a desired temperature to the film which is made of, for example, polyvinylidene fluoride, blended material such as polyvinylidene fluoride and PZT powder, polyvinyl fluoride, polyacrylonitrile, copolymers of vinylidene fluoride such as vinylidene fluoride and tetrafluoroethylene or trifluoroethylene.

The front electrode layer 10 is formed by a method such as vapour coating, plating or spattering of electric-conductive material, or bonding of electric-conductive foil or plate.

The protecting layer 11 is formed by coating a material such as polyethelene terephthalate, enamel, epoxy resin, polyester or nylon on the surface of the front electrode 10, or formed by bonding a film of the same material to the surface. The protecting surface functions as a protector for the front electrode as well as functions to adjust the resonant frequency. The protecting layer 11 may be varied according to necessity.

The supporting body 7 is omitted where the rear electrode plate serving concurrently as rear reflector plate has sufficient strength and rigidity to support the layers located at front side of the rear electrode plate. The reflector plate function is not always needed and in this case a plate functioning only as an electrode may be provided on the rear surface of the polymeric piezoelectric film 9.

Alternatively, where a rear reflector plate is required, it is possible to provide both plates separately, one of which is the electrode and the other of which is the reflector. For example, where the reflector plate is formed with a material having large acoustic impedance such as a ceramic plate, the rear electrode strips may be easily fabricated on the reflector plate by a method such as etching.

The thickness of the plate functioning as reflector is generally chosen at one fourth of the wave length of the working frequency. However, the thickness may be chosen to be smaller than that length depending upon the ultimate use of the completed transducer.

Each of lead wires (12A1, 12A2,—, 12An) is independently connected to a corresponding rear electrode strip (A1, A2,—, An) so that each rear electrode strip can be driven independently by a driving voltage applied to it through each lead wire (12A1, 12A2,—, 12An).

In the previously described embodiment, the rear electrode is formed with multiple strips and the front electrode is formed in common with one plate. However, it is possible to construct a transducer such that the rear electrode is formed in common with one plate and the front electrode is formed with a series of separated strips. It is also possible to construct a transducer such that both rear and front electrodes are provided with series of separated strips respectively in which strips in both series are located as to face each other across the polymer piezoelectric film 9.

In accordance with the above embodiment, each piezoelectric vibration element (Tm) is formed by one separated electrode (Am), the portion of the polymeric piezoelectric film which faces the separated electrode (Am), and the portion of the other electrode 10 which corresponds to the separated electrode (Am).

Figure 5:
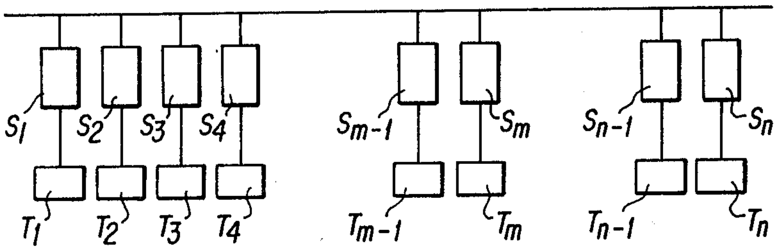
FIG. 5 illustrates diagramatically the basic electrical connections for the purpose of explaining the scanning method.

The arrangement of the multiple vibration elements (T1, T2,—, Tm,—, Tn) (where m is less than n) are schematically shown in FIG. 5 with the same marks (T1, T2,—, Tm,—, Tn). Switches and/or phase control elements such as delay elements (S1, S2,—, Sm,—, Sn) are connected to the vibration elements (T1, T2,—, Tm,—, Tn). When groups of (m) vibration elements, that is, (T1, T2, T3,—, Tm); (T2, T3, T4,—,Tm+1);—; (Tn−m+1, Tn−m+2, Tn−m+3,—, Tn) are driven in regular sequence, ultrasound beams transmit from the transducer which scan spatially along the direction of the arrangement of the multiple vibration elements (T1, T2,—, Tm,—, Tn), and thus an electronic linear scanning of ultrasound beams is accomplished.

A scanning method of multiple piezoelectric vibration elements is explained more detail in "ULTRASONICS" July 1968 pages 153–159, and in "TOSHIBA REVIEW" No. 114 March-April 1978 pages 13–17.

When the vibration elements (T1, T2,—, Tm,—, Tn) are driven in the same phase, the propagating direction of the wave fronts of the resultant waves which come out from each vibration element is normal to the transmitting surface of the ultrasonic waves.

When the driving phases of the vibration elements are successively delayed at a constant desired interval, the propagating direction of the wave fronts of the resultant waves becomes inclined to the normal direction with the angle of inclination being a function of the phase interval, and therefore, an electronic sector scanning of ultrasonic waves is accomplished here.

Figure 6:
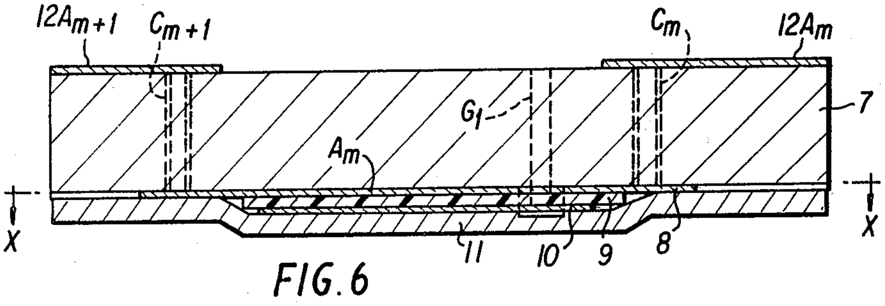
FIG. 6 illustrates a schematic longitudinal cross-section view of another embodiment of the scanning type piezoelectric vibration transducer in accordance with the present invention.
Figure 7:
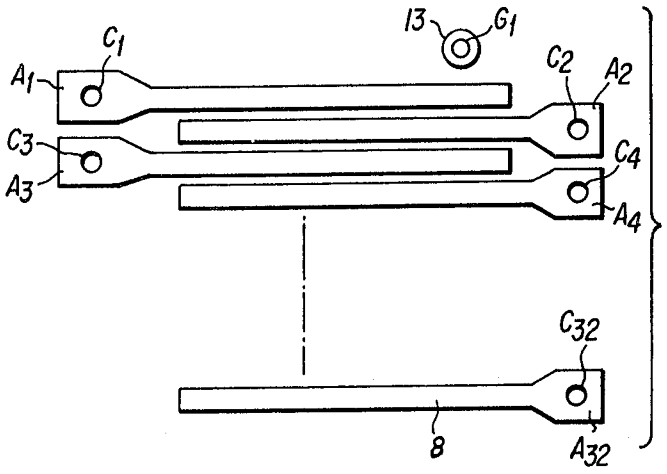
FIG. 7 illustrates a schematic partial top view of the cross section at the plane x—x of the transducer shown in FIG. 6.

In a second embodiment of the present invention shown in FIGS. 6 and 7, a combined rear electrode and reflector plate 8 of copper foil having the thickness of 0.050 mm is bonded to the surface of a supporting body 7 of glass fiber reinforced epoxy resin having an acoustic impedance of about $5.0\times10^6$ kg/m$^2$ sec and a thickness of 2 mm at thinnest portion. The thirty-two (32) rear electrode strips (A1, A2,—, A32) having a line length of 10 mm and a width of 0.4 mm in each are aranged on the surface of the supporting body 7 by photo-etching with a gap of 0.1 mm; that is, a pitch of 0.5 mm. The end of each electrode is connected to a wire of distribution (12A1, 12A2,—, 12A32) by etching on the rear surface of the supporting body 7. Each wire of distribution (12A1, 12A2,—, 12An) is connected to a corresponding electrode strip (A1, A2,—, A32) by through-hole plating passing through the supporting body 7 at the positions marked (C1, C2,—, C32) in FIG. 7.

A polymeric piezoelectric film 9 having a length of about 20 mm and a width of about 12 mm which is obtained by polarization of an uniaxially oriented polyvinylidene fluoride film having the thickness of 0.070 mm is bonded to the front surface of the rear electrode strips with epoxy resin.

A front electrode plate 10 is formed by vaporization of A1 on the front surface of the polymeric piezoelectric film 9. The front electrode plate 10 is connected to a terminal 13 positioned at the rear surface of the supporting body 7 by through-hole plating passing through the body 7 at the position marked with G1 in FIG. 7.

A protecting layer 11 of polyethylene terephthalate film having the thickness of 0.100 mm is bonded with cyanoacrylate to the whole front surface of the fabricated body. The fabricated body is further reinforced by a coating of glass-fiber filled epoxy resin on the rear surface of the fabricated body. The whole side surface of the fabricated body is coated with epoxy resin to make the body waterproof.

Figure 8:
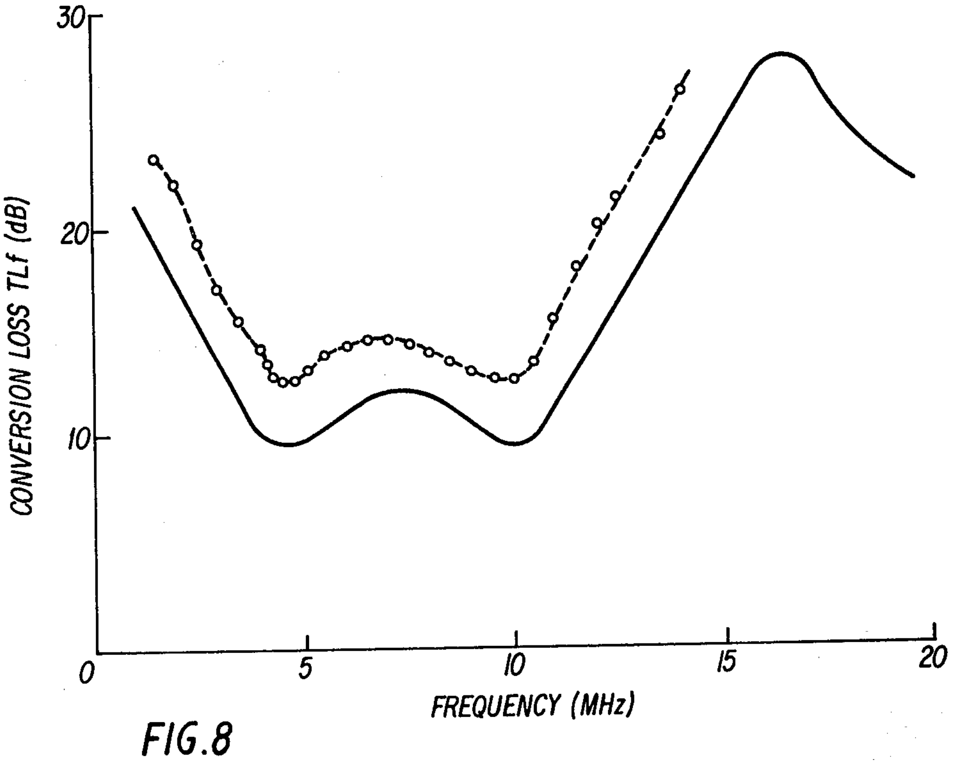
FIG. 8 illustrates a graph showing the relationships between the frequencies of ultrasonic waves transmitted from the transducer in accordance with the present invention and its electro-acoustic conversion losses, both nominal and actual.

The transducer thus constructed is securely mounted in a housing. Each of the electrode terminals (12A1, 12A2,—, 12A32) is connected in parallel to an electric source. The transducer is driven so that ultrasonic waves are transmitted from the front surface of the transducer into water. Both theoretical results and actual measuring results relating to the conversion loss (TLf) are shown in FIG. 8 as a function of frequency, in which the frequency in MHz is shown on the abscissa and conversion loss (TLf) in dB is shown on the ordinate. In FIG. 8, the dotted line curve shows the actual measured results and the solid line curve illustrates the theoretically expected results.

The conversion loss (TLf) is defined as follows:

Conversion loss (TLf) = −10. log (PAf/Pt) where Pt is electric power poured into the transducer from the electric source and PAf is acoustic power delivered into the front environment. It is clear from FIG. 8 that the actual measured results substantially coincide with the theoretically expected results on the resonant frequency which appears at about 4.5 MHz and at about 10 MHz, and on the conversion loss (TLf) within difference of 4 dB.

Next, each of the electrode terminals (12A1, 12A2,—, 12A32) is connected to a delay circuit comprising inductive elements, capacitors and transformers to match the electric impedance and to delay driving the vibration on elements a desired amount. The vibration elements are driven with high-frequency pulse of 5 MHz, for 5 microseconds with a successively delayed phase acting on each of the electrodes. It is observed that ultrasound beams having deflected direction are transmitted from the transducer. This means that sector scanning of ultrasound beams is possible with the transducer by varying and controlling delay time of voltage applied to each vibration element suitably.

Figure 9:
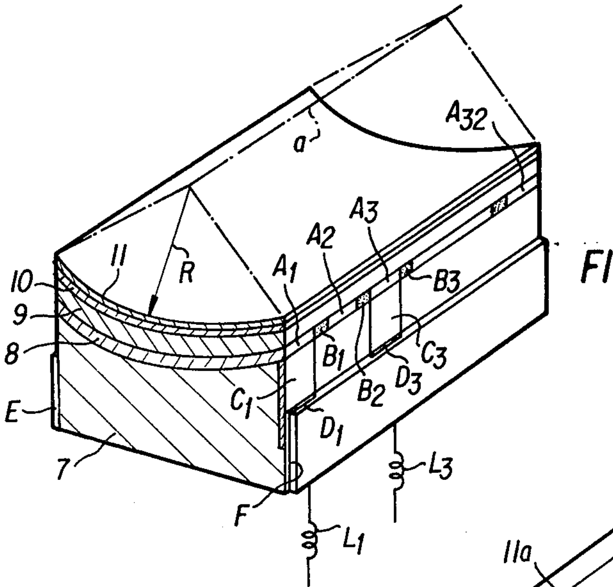
FIG. 9 illustrates a schematic perspective view of one embodiment of the scanning and focusing type piezoelectric vibration transducer in accordance with the present invention.

In the third embodiment of the present invention illustrated in FIG. 9, the upper side corresponds to the front side of the transducer and the lower side corresponds to the rear side. In this embodiment, a supporting body 7 has a cylindrical surface having a desired radius of curvature R at its front surface measured from axis a. On the cylindrical surface, separated rear electrode strips (A1, A2,—, An) are formed with a desired pitch. The gaps (B1, B2,—, Bn−1) between the strips (A1, A2,—, An) are filled up with an insulating material. On the surfaces of the strips, a polymeric piezoelectric film 9 is bonded. On the front surface of the polymeric piezoelectric film 9, a front electrode plate 10 is fabricated. Further, on the front surface of the front electrode plate 10, a protecting layer 11 is formed. The configuration of the fabricated layers comprising the rear electrode strips, the polymeric piezoelectric film, the front electrode plate and the protecting layer corresponds to the curved figure of the cylindrical front surface of the supporting body 7.

The rear electrode strips (A1, A2,—, An) are connected alternately to one group of pick-up leads (C1, C3,—) formed on the right side wall of the transducer and another group of pick-up leads (C2, C4,—) (not shown) formed on the opposite side wall of the transducer. Connector plates F and E having one group of lead wires (L1, L3,—) and another group of lead wires (L2, L4,—) respectively are attached to the right side wall and the opposite side wall of the transducer respectively. One group of pick-up leads (C1, C3,—) are connected to one group of leads wires (L1, L3,—) at the portions (D1, D3,—) shown in FIG. 9, and another group of pick-up leads (C2, C4,—) are similarly connected to another group of leads wires (L2, L4,—) at the portions (D2, D4,—) (not shown).

Thus, a focusing and scanning type piezoelectric vibration transducer having a cylindrical front surface formed with a desired radius of curvature (R) along an axis shown with imaginary line (a) in FIG. 9 is obtained.

During fabrication of the transducer shown in FIG. 9, all techniques applied to the first and second embodiments mentioned before can be also applied. Further, when driving this transducer, all techniques applied to the first and second embodiments mentioned before can be also applied.

Figure 10:
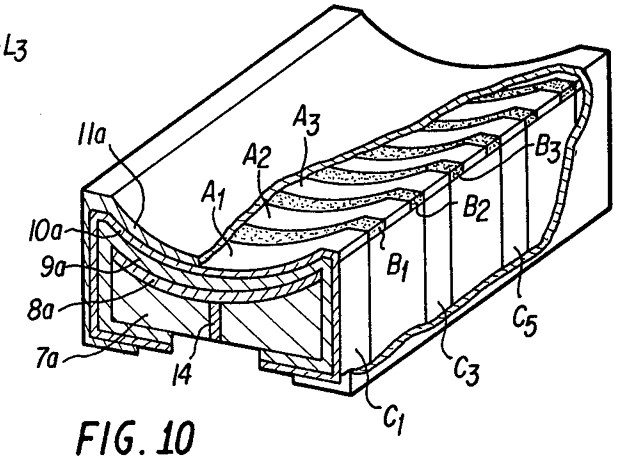
FIG. 10 illustrates a schematic perspective view of another embodiment of the scanning and focusing type piezoelectric vibration transducer in accordance with the present invention.

A fourth embodiment of the present invention which is shown in FIG. 10 is at variance with the transducer shown in FIG. 9 inasmuch as in the transducer shown in FIG. 10 a rear electrode is formed with a common plate 8*a* and a front electrode is formed with separated electrode strips (A1, A2,—, An). The transducer shown in FIG. 10 to have a desired cylindrical front surface comprises a supporting body 7*a*, a rear electrode plate 8*a*, a polymeric piezoelectric film 9*a*, front electrode strips 10*a* (A1, A2,—, An), a protecting layer 11*a*, a through-hole lead 14 connected to the rear electrode plate 8*a*, one group of leads (C1, C3,—) connected to the strips (A1, A3,—), another group of leads (C2, C4,—) connected to the strips (A2, A4,—), and an insulating material filling up gaps (B1, B2,—, Bn−1).

The constructive characteristic of the transducer shown in FIG. 10 is that the fabricated layers of the polymeric piezoelectric film 9*a*, the front electrode strips 10*a* and the protecting layer 11*a* continously extends out from the surface of the rear electrode plate 8*a*, is bent and passes along the both side walls of the supporting body 7*a*, and is further bent and reaches the end portions of the rear surface of the supporting body 7*a*. The illustrated construction simplifies the connections of lead wires to the separated electrode strips.

The cylindrical portion of transducers having cylindrical front surface can be filled up with suitable packing material to make flat the whole front surface of the transducer according to need.

Figure 11:
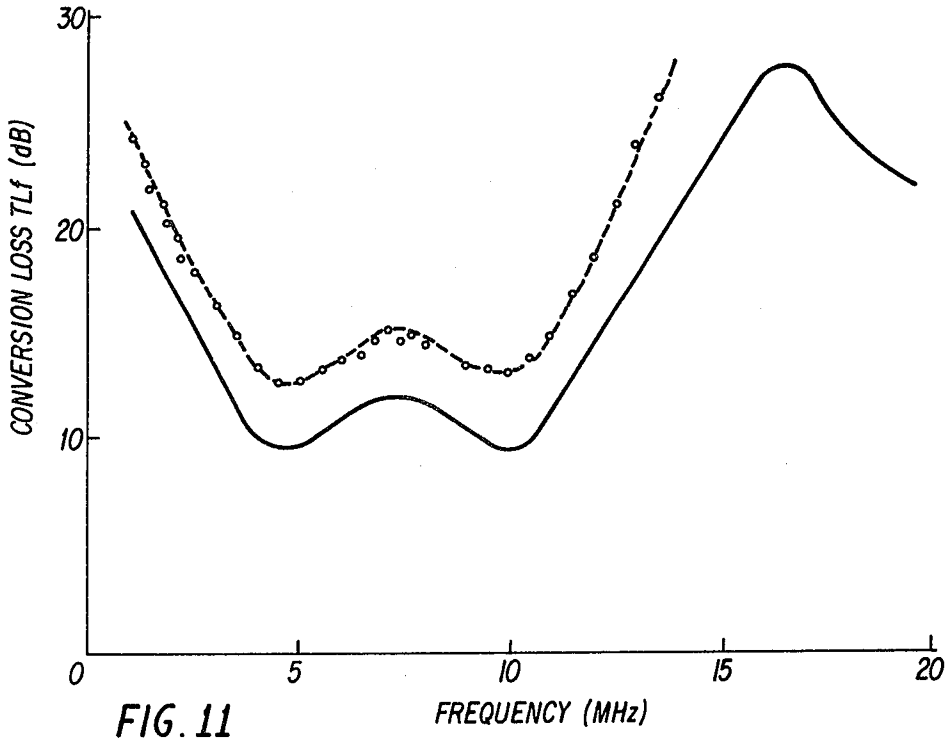
FIG. 11 illustrates a graph showing the relationships between the frequencies of ultrasonic waves transmitted from the transducer in accordance with the present invention and its electro-acoustic conversion losses, both nominal and actual.

A transducer having the construction shown in FIG. 9 can be constructed in which the cylindrical surfce of the supporting body 7 is formed by thermal deformation. The other fabrication steps are the same as the fabrication steps used in the practical embodiment previously mentioned in conjunction with FIG. 6. When this transducer is driven with well known methods of linear scanning and sector scanning respectively, scanning of the wave fronts of the ultrasonic waves from the front surface of the transducer along the direction of the axis (a) shown in FIG. 9 is confirmed. In this case, both theoretically expected results and actual measured results relating to the conversion loss (TLf) are shown in FIG. 11 as a function of frequency. It is observed that the results shown in FIG. 11 are substantially equal to the results shown in FIG. 8.

The following three embodiments of the present invention are characterized in that the polymeric film provided in the transducer as an active element has polarized portions and non-polarized portions. The polarized portions face the electrode strips and the non-polarized portions face the gaps between the strips. This construction is effective for reducing the cross-talk between the vibrational elements since the non-polarized portions function as an acoustic damper as well as an electric insulator.

Figure 12:
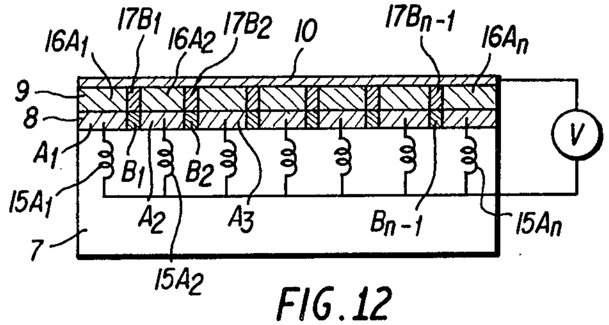
FIGS. 12 and 13 illustrate schematic longitudinal cross secion views for explaining one of the producing steps for the other embodiments of scanning type piezoelectric vibration transducer in accordance with the present invention.

In the fifth embodiment of the present invention shown in FIG. 12, the combined rear electrode strips (A1, A2,—, An) and rear reflector plate 8 are formed on the surface of the holder 7. The gaps (B1, B2,—, Bn−1) between the strips are filled with an insulating material. A continous polarizable polymeric film 9 is bonded to the surface of the rear electrode strips, and a front electrode plate 10 is bonded to the surface of the film 9. Then, lead wires (15A1, 15A2,—, 15An) are connected to each other and high voltage is applied between the rear electrode strips and the front electrode plate. Thus, a transducer having polarized portions (16A1, 16A2,—, 16An) and at least partially non-polarized portions (17B1, 17B2,—, 17Bn−1) is obtained. This transducer works especially advantageously as a scanning type transducer. In this transducer, where its front surface is made cylindrical in shape as shown in FIG. 9 or 10, it functions as a focusing and scanning type transducer.

Figure 13:
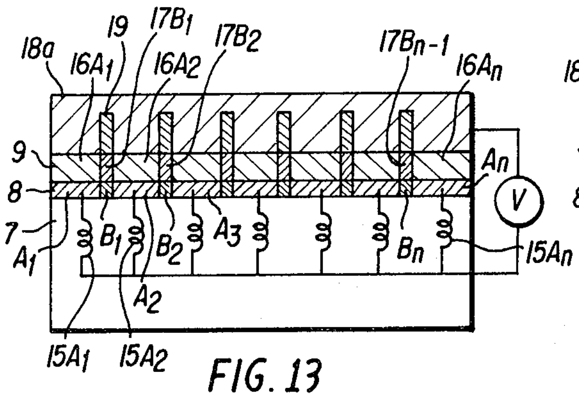

In the sixth embodiment of the present invention shown in FIG. 13, a front comb shaped electrode plate 18*a* is employed just for polarization of the film 9 instead of the front electrode plate 10 shown in FIG. 12. The front comb shaped electrode plate 18*a* has striped surfaces the bottom of which are insulated with insulating portions 19. The film 9 is polarized with the electrode plate 18*a* in the position shown in FIG. 13. After that, the electrode plate 18*a* is removed and a continous sheet front electrode plate or a patterned front electrode plate, in which the pattern corresponds to the pattern of the rear electrode strips, is formed on the surface of the film 9. In this embodiment, the differences between the polarized portions and the non-polarized portions becomes more clearly defined than in the fifth embodiment.

Figure 14:
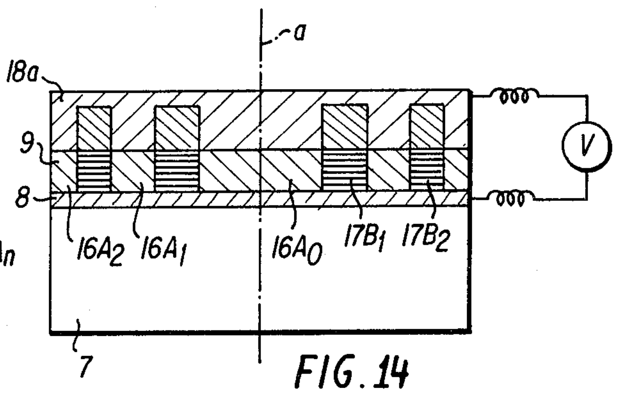
FIG. 14 illustrates a schematic longitudinal cross section view for explaining one of the producing steps for one embodiment of focusing type piezoelectric vibration transducer in accordance with the present invention.

In the seventh embodiment of the present invention shown in FIG. 14, the fabricated body has a cylindrical shape with an axis of revolution shown as imaginary line a. A rear electrode plate 8 is formed on the surface of a holder 7 and a continuous polarizable polymer film 9 is bonded to the rear electrode plate 8. A front electrode plate 18*a* is temporarily attached on the surface of the film 9. The front electrode plate 18*a* has ring grooves on the bottom surface with relations according to Fresnel's ring which is derived from the Hygens- Fresnel principle. With this construction, the film 9 is polarized thus forming the ring polarized portions (16A0, 16A1, 16A2) and the ring non-polarized portions (17B1, 17B2). After that, the electrode plate 18*a* is removed and front electrode is formed on the whole surface of the film 9. Thus, a focusing transducer is constructed which the ultrasonic waves transmitting from the transducer are focussed under Fresnel's theory.

While various embodiments of the invention have been described in detalk, the scope of the invention is to encompass the equivalent embodiments not specifically described but still included in the scope of the following claims.

What is claimed is:

1. A piezoelectric ultrasonic vibration transducer comprising a series of vibration elements comprising a polymeric piezoelectric film sandwiched by electrode plates, a front surface of the series of vibrational elements being cylindrically concave about a common axis, the polymeric piezoelectric film being continuous through the series of vibrational elements, each of the series of vibrational elements forming an arc substantially perpendicular to the common axis.

2. A piezoelectric ultrasonic vibration transducer as claimed in claim 1 in which said vibration elements are arranged in substantially parallel order.

3. A piezoelectric ultrasonic vibration transducer as claimed in claim 1 in which said polymeric piezoelectric film comprises a continuous sheet passing across said series.

4. A piezoelectric ultrasonic vibration transducer as claimed in claim 3 in which one of said electrode plates comprises a continuous sheet passing across said series.

5. A piezoelectric ultrasonic vibration transducer as claimed in claim 3 in which said polymeric piezoelectric film contains at least partially non-piezoelectric portions which correspond to gaps between said vibration elements.

6. A piezoelectric ultrasonic vibration transducer as claimed in claim 1 in which said series of vibrational elements is attached to a supporting body.

7. A piezoelectric ultrasonic vibration transducer as claimed in claim 1 in which one of said electrode plates serves concurrently as a rear reflector plate.

8. A piezoelectric ultrasonic vibration transducer as claimed in claim 1 in which one of the surfaces of said series of vibrational elements is covered with a protecting layer.

9. A piezoelectric ultrasonic vibration transducer as claimed in claim 6 in which said lead wires are formed by through-hole plating passing through said supporting body.

10. A scanning and focusing piezoelectric ultrasonic vibration transducer comprising a support having a cylindrically concave surface, a vibration element contiguously conformed to the concave surface of the support, and a protecting layer covering the vibration element, the vibration element comprising a plurality of electrode strips arranged substantially parallel to each other, a continuous electrode plate arranged substantially parallel to the plurality of electrode strips, and a continuous film situated contiguously between the electrode plate and the electrode strips, the film composed of polymeric piezoelectric material.

11. The transducer of claim 10 wherein the plurality of electrode strips of the vibrational element are fixed directly to the concave surface of the support.

12. The transducer of claim 11 wherein the film of polymeric piezoelectric material of the vibration element is polarized in regions coincident with the plurality of electrode strips and at least partially non-polarized elsewhere.

13. The transducer of claim 10 wherein the continuous electrode plate of the vibrational element is fixed directly to the concave surface of the support.

14. The transducer of claim 13 further comprising a lead connected to the continuous electrode plate, the lead extending through a central portion of the support.

15. The transducer of claim 10 wherein gaps between adjacent electrode strips of the vibration element are filled with an insulating material.

16. The transducer of claim 10 wherein the plurality of electrode strips of the vibration element are arranged substantially perpendicular to the axis of the cylinder defining the concave surface of the support.

17. The transducer of claim 10 wherein the support further comprises a pair of side walls extending downward from the concave surface and parallel to the axis defining the concave surface.

18. The transducer of claim 17 further comprising two groups of pick-up leads, each group being situated on a respective one of the pair of side walls of the support, one of the groups of pick-up leads being connected to a first spaced series of the electrode strips of the vibrational element, the other of the group of pick-up leads being connected to the remaining electrode strips of the vibrational element.

19. The transducer of claim 18 wherein each group of pick-up leads extends partially onto a rear surface of the support.

20. The transducer of claim 10 wherein the protecting layer covering the vibrational element further comprises suitable packing material to make the front surface of the transducer flat.

* * * * *

UNITED STATES PATENT AND TRADEMARK OFFICE
CERTIFICATE OF CORRECTION

PATENT NO. : 4,424,465

DATED : January 3, 1984

INVENTOR(S) : Ohigashi et al

It is certified that error appears in the above-identified patent and that said Letters Patent is hereby corrected as shown below:

On the cover sheet, below the filing date, line item [22], insert:

-- [30] Foreign Application Priority Data
May 16, 1979 [JP] Japan 54-59979
May 16, 1979 [JP] Japan 54-59980 --

On the cover sheet, in item [56]: For "Nakanishi" read

-- Nakanishi et al --

Column 1, line 23: For "BaTi03" read -- $BaTiO_3$ --

Column 4, line 37: For "spattering" read -- sputtering --

Column 6, line 12: For "A1" read -- Al --

Column 9, line 10: For "detalk" read -- detail --

Signed and Sealed this

*Sixteenth* Day of *April 1985*

[SEAL]

*Attest:*

DONALD J. QUIGG

*Attesting Officer* *Acting Commissioner of Patents and Trademarks*